United States Patent [19]

Uemura et al.

[11] Patent Number: 5,679,476
[45] Date of Patent: Oct. 21, 1997

[54] EPITAXIAL WAFER AND METHOD OF FABRICATING THEREOF

[75] Inventors: Noriyuki Uemura, Hiratsuka; Mitsuo Kono, Hadano, both of Japan

[73] Assignee: Komatsu Electronic Metals Co., Ltd., Hiratsuka, Japan

[21] Appl. No.: 671,204

[22] Filed: Jun. 27, 1996

[51] Int. Cl.⁶ .................. B32B 9/00; B32B 9/04; C30B 29/06; C01B 33/02
[52] U.S. Cl. .................. 428/700; 428/446; 428/219; 117/904; 117/932; 423/348; 257/352; 257/617
[58] Field of Search .................. 423/328.2, 348; 117/904, 932; 257/347, 352, 617; 428/312.6, 446, 700

[56] References Cited

U.S. PATENT DOCUMENTS

| | | | |
|---|---|---|---|
| 3,664,867 | 5/1972 | Galli et al. | 428/700 |
| 4,323,417 | 4/1982 | Lam | 156/613 |
| 4,498,951 | 2/1985 | Tamura et al. | 117/904 |
| 5,264,296 | 11/1993 | Doll et al. | 428/446 |
| 5,320,907 | 6/1994 | Sato | 428/446 |
| 5,387,459 | 2/1995 | Hung | 428/209 |
| 5,492,752 | 2/1996 | Parsons et al. | 428/446 |
| 5,506,433 | 4/1996 | Ohori et al. | 257/352 |

*Primary Examiner*—Cathy F. Lam
*Attorney, Agent, or Firm*—Varndell Legal Group

[57] ABSTRACT

An epitaxial wafer capable of removing impurities and oxide layers thereon having a high dielectric strength is disclosed. A substrate wafer 1 in which laser-scattering centers have a density of higher than $5\times10^6/cm^3$ is provided. An epitaxial layer 3 is formed by epitaxial growth on a completely clean surface of the substrate. The surface of the epitaxial layer consists of a non-defect layer which is provided for device active regions. Moreover, a high density of laser-scattering centers are distributed near the interface of the epitaxial layer and the substrate wafer and the interior of the substrate, thus providing for a wafer capable of removing impurities.

3 Claims, 1 Drawing Sheet

EPITAXIAL WAFER AND METHOD OF FABRICATING THEREOF

BACKGROUND OF THE INVENTION

1. Field of the Invention

The present invention relates to an epitaxial wafer and a method of fabricating thereof.

2. Description of Prior Art

A conventional epitaxial wafer is fabricated by growing a single crystal silicon layer on a substrate. Referring to FIG. 1, a silicon wafer 1 as the substrate contains a number of laser-scattering centers 2. Laser-scattering centers 2 are defects which can be detected when they scatter rays of infrared laser irradiated on the wafer by using a vertical scattering method or a transmission (interference) scattering method. Laser-scattering centers 2 are uniformly distributed throughout the substrate and typically have a density of about $1\times10^6/cm^3$ in the prior art. When an epitaxial layer is formed on the substrate to be an epitaxial wafer, referring to FIG. 2, the density of laser-scattering centers 2 throughout substrate 1 is the highest in the epitaxial level, and the value decreases from the interface of epitaxial layer 3 and the substrate 1 to the interior of epitaxial layer 3.

However, if the epitaxial layer is formed on a substrate whose laser-scattering center density is less than $1\times10^6/cm^3$, and the epitaxial wafer is contaminated in any successive process step, such as device formation, the impurities cannot be removed since there are not enough trap centers in the substrate. Therefore, a property of the device will be affected.

SUMMARY OF THE INVENTION

Accordingly, the present invention provides an epitaxial wafer which is capable of removing impurities, thereby providing the devices thereon with good electrical properties.

The epitaxial wafer of the present invention has an epitaxial layer formed on a substrate wafer, which substrate wafer has laser-scattering centers in a density of more than $5\times10^6/cm^3$, whereby the surface of the epitaxial layer consists of a non-defect layer and the substrate wafer is provided with a layer capable of removing impurities.

A method of the present invention comprises the steps of: forming a single-crystal rod by pulling up from a crucible with a high pulling up speed or with a high rotation speed of the crucible so that more than $5\times10^6/cm^3$ laser-scattering centers are contained in the single-crystal rod; slicing the single-crystal rod into single-crystal substrates; and forming an epitaxial growth layer on the single-crystal substrates.

In the aforementioned epitaxial wafer, since the substrate contains a high density of laser-scattering centers, laser-scattering centers near the interface of the epitaxial layer are distributed as in the substrate. However, only the surface region of the epitaxial layer which serves as an active layer in a device contains no laser-scattering centers. That is, the surface region is a non-defect layer. Moreover, the number of laser-scattering centers in the epitaxial layer will not increase after simulated annealing processes as shown in FIG. 3. Therefore, good electrical properties in the surface region of the epitaxial layer can be retained even after the device fabrication process. Furthermore, since a high density of laser-scattering centers distribute in regions other than the surface region, the epitaxial wafer has a high ability to remove impurities.

BRIEF DESCRIPTION OF THE DRAWINGS

The description is made with reference to the accompanying drawings, in which.

Other objects, features, and advantages of the present invention will become apparent from the following detailed description of the preferred but non-limiting embodiment.

PREFERRED EMBODIMENT OF THE INVENTION

In the present invention, a single-crystal silicon material produced by the Czochralski (CZ) method in a single-crystal pulling apparatus is provided for the substrate of the epitaxial wafer. There will be more laser-scattering centers in the single-crystal material. The single-crystal material is formed by pulling up the single-crystal from a crucible with high pulling up speed (>1.8 mm/min) so that more laser-scattering centers are contained in the single-crystal material. Then there will be more laser-scattering centers in the single-crystal material. Therefore, the density of the laser-scattering centers in the single-crystal material may be more than $5\times10^6/cm^3$ by the present method.

Figure 1:
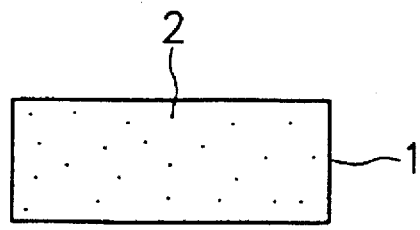
FIG. 1 is a cross-sectional view of a silicon substrate for forming an epitaxial wafer.
Figure 2:
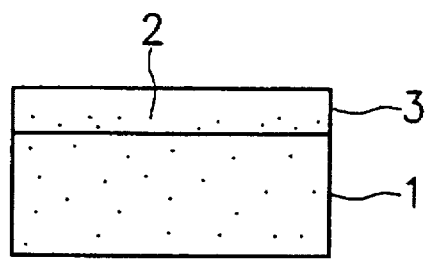
FIG. 2 is a cross-sectional view of the epitaxial wafer.
Figure 3:
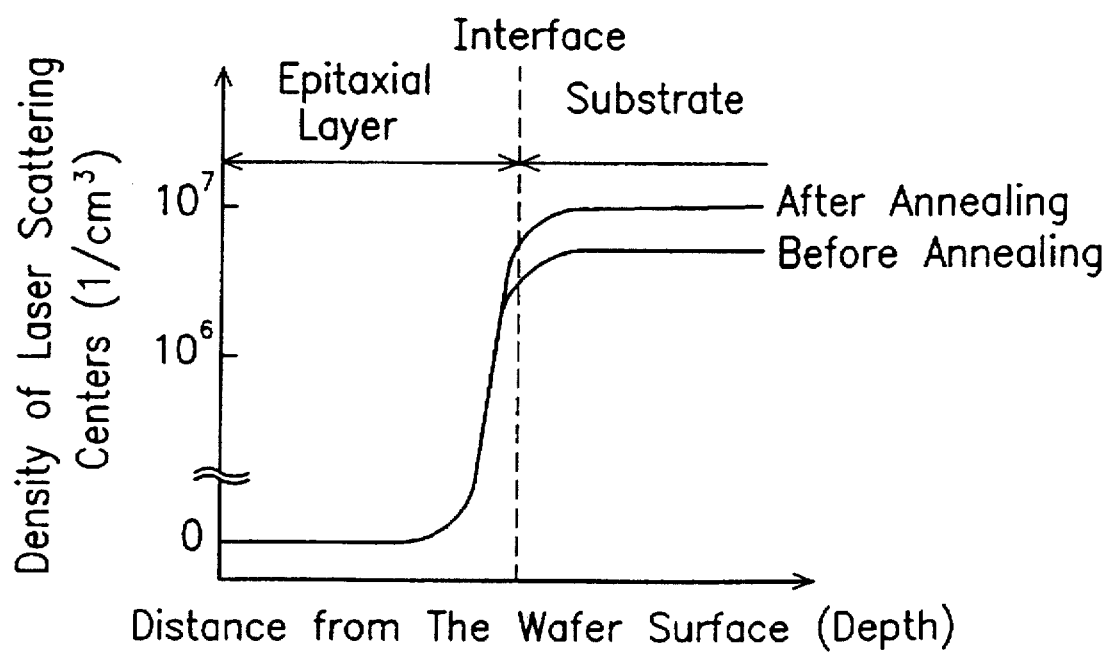
FIG. 3 illustrates a simulated distribution of laser-scattering centers in the epitaxial wafer before and after an annealing process.

Referring to FIG. 1, a single-crystal silicon substrate 1 containing the laser-scattering centers having a density of more than $5\times10^6/cm^3$ for the present invention. Then, referring to FIG. 2, an epitaxial layer 3 is formed on the substrate 1. Therefore, a non-defect layer exists only in the surface region of epitaxial layer 3, while the internal regions of epitaxial layer 3 and the substrate 1 contain a high density of laser-scattering centers. That is, the epitaxial growth can produce a wafer having an intrinsic gettering structure. Thus, in order to fabricate wafers of better electrical properties and an intrinsic gettering structure, the epitaxial growth should be carried out on a silicon substrate, which substrate contains laser-scattering centers of more than $5\times10^6/cm^3$. Since the surface region of the epitaxial layer is provided for device active regions, the epitaxial growth must maintain complete cleanliness.

The silicon wafer of the present invention is stable during the fabricating process of the devices thereon. Moreover, the laser-scattering centers will not diffuse into the surface region of the epitaxial layer after annealing processes.

As stated above, since a silicon wafer containing laser-scattering centers having a density of higher than $5\times10^6/cm^3$ is provided for the substrate of the epitaxial wafer, the distribution of laser-scattering centers near the interface of the epitaxial layer and the substrate is the same as that in the substrate. Nevertheless, the surface region of the epitaxial layer, which is provided for active regions, has no laser-scattering centers and is a non-defect layer. Therefore, the devices fabricated thereon can have good electrical properties, for example, the oxide layers of the device can be reliable to higher voltages. Moreover, the non-defect layer in the surface region can be retained after annealing processes. Thus, an epitaxial wafer containing a high density of laser-scattering centers as intrinsic getterings in the substrate can be obtained.

What is claimed is:

1. An epitaxial wafer produced by a process of epitaxially growing an epitaxial layer on a substrate wafer, the substrate wafer having laser-scattering centers in a density of more than $5\times10^6/cm^3$, whereby the surface of the epitaxial layer consists of a non-defect layer, and the substrate wafer and a portion of the epitaxial layer adjacent the substrate wafer are capable of removing impurities.

2. An epitaxial wafer fabricated by a method comprising the steps of:

forming a single-crystal rod by pulling up from a crucible with high pulling up speed so that more than $5 \times 10^6/cm^3$ laser-scattering centers are contained in the single-crystal rod;

slicing the single-crystal material into single-crystal substrates; and forming an epitaxial growth layer on the single-crystal substrates.

3. An epitaxial wafer fabricated by a method comprising the steps of:

forming a single-crystal rod by pulling up from a crucible while controlling a rotation rate of the crucible so that more than $5 \times 10^6/cm^3$ laser-scattering centers are contained in the single-crystal rod;

slicing the single-crystal material into single-crystal substrates; and forming an epitaxial growth layer on the single-crystal substrates.

* * * * *